United States Patent
Jeong et al.

(10) Patent No.: US 11,156,914 B2
(45) Date of Patent: Oct. 26, 2021

(54) DAMASCENE TEMPLATE FOR NANOELEMENT PRINTING FABRICATED WITHOUT CHEMOMECHANICAL PLANARIZATION

(71) Applicant: Northeastern University, Boston, MA (US)

(72) Inventors: Hobin Jeong, Malden, MA (US); Ahmed Busnaina, Needham, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 16/485,073

(22) PCT Filed: Feb. 12, 2018

(86) PCT No.: PCT/US2018/017824
§ 371 (c)(1),
(2) Date: Aug. 9, 2019

(87) PCT Pub. No.: WO2018/148659
PCT Pub. Date: Aug. 16, 2018

(65) Prior Publication Data
US 2019/0384168 A1    Dec. 19, 2019

Related U.S. Application Data

(60) Provisional application No. 62/457,679, filed on Feb. 10, 2017.

(51) Int. Cl.
*G03F 7/00* (2006.01)
*C25D 13/22* (2006.01)
(Continued)

(52) U.S. Cl.
CPC .......... *G03F 7/0002* (2013.01); *C25D 13/22* (2013.01); *B82Y 30/00* (2013.01); *B82Y 40/00* (2013.01)

(58) Field of Classification Search
CPC ......... G03F 7/0002; G03F 1/80; C25D 13/22; C25D 13/00; C25D 13/02; C25D 15/00;
(Continued)

(56) References Cited

U.S. PATENT DOCUMENTS 7,247,349 B2 *  7/2007  Ozin .................. B32B 3/30
                                                     427/162
7,999,353 B1 *  8/2011  Odom ................ G02B 6/1226
                                                     257/618
(Continued)

FOREIGN PATENT DOCUMENTS

KR  10-2009-0108914  10/2009
KR  10-2014-0097332   8/2014
(Continued)

OTHER PUBLICATIONS

Janssen et al., "Static solvent contact angle measurements, surface free energy and wettability determination of various self-assembled monolayers n silicon dioxide", Thin Solid Films, 2006: vol. 515, p. 1433-1438.
(Continued)

*Primary Examiner* — Xiuyu Tai
(74) *Attorney, Agent, or Firm* — Verrill Dana, LLP

(57) ABSTRACT

Methods of fabricating a damascene template for electrophoretic assembly and transfer of patterned nanoelements are provided which do not require chemical mechanical polishing to achieve a uniform surface area. The methods include conductive layer fabrication using a combination of precision lithography techniques using etching or building up the conductive layer to form raised conductive features separated by an insulating layer of equal height.

7 Claims, 11 Drawing Sheets

(51) Int. Cl.
*B82Y 30/00* (2011.01)
*B82Y 40/00* (2011.01)

(58) Field of Classification Search
CPC ......... B82Y 30/00; B82Y 40/00; B82Y 10/00; B82B 3/0042; B82B 1/00; B32B 37/14; Y10S 977/882; H01L 21/76813; H01L 21/76811; H01L 21/32136; H01L 21/31144; H01J 37/321; C23F 4/00; Y10T 156/10; Y10T 428/24355; Y10T 428/26; Y10T 428/24388
See application file for complete search history.

(56) References Cited

U.S. PATENT DOCUMENTS

| | | | |
|---|---|---|---|
| 2003/0049934 A1* | 3/2003 | Buie | H01J 37/321 438/684 |
| 2003/0057525 A1 | 3/2003 | Fock et al. | |
| 2006/0134905 A1* | 6/2006 | Barwicz | H01L 21/76813 438/618 |
| 2008/0241499 A1 | 10/2008 | Sinapi et al. | |
| 2009/0087622 A1 | 4/2009 | Busnaina et al. | |
| 2009/0134033 A1 | 5/2009 | Mead et al. | |
| 2009/0189287 A1 | 7/2009 | Yang et al. | |
| 2010/0003782 A1 | 1/2010 | Sinha et al. | |
| 2010/0183844 A1 | 7/2010 | Xiong et al. | |
| 2010/0215909 A1 | 8/2010 | MacDonald | |
| 2010/0239794 A1 | 9/2010 | Andrews et al. | |
| 2010/0311613 A1 | 12/2010 | Busnaina et al. | |
| 2011/0244116 A1 | 10/2011 | Badre et al. | |
| 2012/0326310 A1 | 12/2012 | Busnaina et al. | |
| 2013/0256013 A1 | 10/2013 | Sirman et al. | |
| 2014/0318967 A1* | 10/2014 | Busnaina | C25D 13/00 204/485 |

FOREIGN PATENT DOCUMENTS

| | | |
|---|---|---|
| WO | 2006133265 A2 | 12/2006 |
| WO | 2011041682 A1 | 4/2011 |
| WO | 2013070931 A1 | 5/2013 |

OTHER PUBLICATIONS

Colvin et al., "Semiconductor Nanocrystals Covalently Bound to Metal Surfaces with Self-Assembled Monolayers", JACS 1992, vol. 144, p. 5221-5230.

Ahn, J.H. et al., "Heterogeneous Three-Dimensional Electronics by Use of Printed Semiconductor Nanomaterials", Science, Dec. 15, 2006, vol. 314, pp. 1754-1757.

Bailey, R. C. et al., "Assembly of Micropatterned Colloidal Gold Thin Films via Microtransfer Molding and Electrophoretic Deposition", Advanced Materials, Dec. 15, 2000, 12, No. 24, pp. 1930-1934.

Hu, L. et al., "Percolation in transparent and conducting carbon nanotube networks", Nano letters 2004, vol. 4, pp. 2513-2517.

Ishikawa, F. N. et al., "Transparent Electronics Based on Transfer Printed Aligned Carbon Nanotubes on Rigid and Flexible Substrates", ACS nano 2008, vol. 3, pp. A-G.

Jaber-Ansari, L. et al., "Mechanism of Very Large Scale Assembly of SWNTs in Template Guided Fluidic Assembly Process", Journal of the American Chemical Society 2009, 131 (2), pp. 804-808.

Krupke, R. et al., "Simultaneous Deposition of Metallic Bundles of Single-walled Carbon Nanotubes Using Ac-dielectrophoresis", Nano Letters, 2003, vol. 3, No. 8, pp. 1019-1023.

Kumachrva E. et al., "Colloidal Crystal Growth on Mesoscopically Patterned Surfaces: Effect of Confinement", Advanced Materials 2002, 14, Issue No. 3, pp. 221-224.

Li, B. et al., "Ultrathin SWNT films with tunable, anisotropic transport properties", Advanced Functional Materials 2011, 21, pp. 1810-1815.

Li, B. et al., "Highly Organized Two- and Three-Dimensional Single-Walled Carbon Nanotube_Polymer Hybrid Architectures", ACS Nano 2011, vol. 5, No. 6, pp. 4826-4834.

Xiong, X. et al., "Large scale directed assembly of nanoparticles using nanotrench templates", Applied Physics Letters (2006), 89(19): 193108-1-193108-3.

Yilmaz, C. et al., "Large-Scale Nanorods Nanomanufacturing by Electric-Field-Directed Assembly for Nanoscale Device Applications", IEEE Transactions of Nanotechnology, vol. 9, No. 5, Sep. 2010, pp. 653-658.

* cited by examiner

DAMASCENE TEMPLATE FOR NANOELEMENT PRINTING FABRICATED WITHOUT CHEMOMECHANICAL PLANARIZATION

CROSS REFERENCE TO RELATED APPLICATIONS

This application claims the benefit under 35 U.S.C. § 119 of U.S. Provisional Patent Appl. No. 62/457,679, filed Feb. 10, 2017, which is incorporated herein by reference in its entirety.

STATEMENT REGARDING FEDERALLY SPONSORED RESEARCH OR DEVELOPMENT

This invention was made with government support under Grant No. 0832785 awarded by the National Science Foundation. The government has certain rights in the invention.

BACKGROUND

Nanomaterials exhibit special mechanical, chemical, electrical, and optical properties, not seen in the bulk scale and intense efforts are ongoing to develop nanomaterials. These efforts have largely relied on silicon wafer-based manufacturing technologies such as lithography, metal deposition, patterning, and etching. However, traditional silicon wafer-based manufacturing technologies have limits, such as the size of the material that can be fabricated with accuracy, and high cost.

Conventional processes used in making nanomaterials, including deposition and lithography, are based on the concept of removal of material, also known as the top-down approach. An opposite concept, the bottom-up approach, is based on building up of nanomaterials and provides an alternative to the traditional top-down approach. The bottom-up approach offers advantages in terms of greater productivity, compatibility with flexible substrates, high performance, and nanoscale resolution. Several bottom-up approaches have been investigated, such as assembly, transfer, and printing. However, their integration and translation into actual applications have been slow. Conventional printing processes, such as screen, gravure, and inkjet printing only allow fabrication of microscale resolution features, and with limited kinds of nanomaterials. Several directed processes for nanomaterial assembly, such as template-guided fluidic, convective, dielectrophoretic, and electrophoretic assembly, have been investigated to overcome some of these problems. Although these assembly processes allow nanoscale features to be achieved with many nanomaterials, they are still slow and are not yet scalable.[1-13]

Another approach is that of offset printing. Offset printing enables printing of nanomaterials based on electrophoretic assembly and transfer using a reusable template, called a damascene template. The process starts with the electrophoretic assembly of nanomaterials on a specifically designed damascene template in a nanomaterial suspension, for example, a suspension of carbon nanotubes (CNT). After assembly, the assembled nanomaterials are transferred to a recipient polymer substrate. Through a surface treatment, the damascene template can be immediately made ready for another assembly and transfer cycle. The offset printing process using a damascene template has been demonstrated to be a versatile method for applying several types of nanomaterials, such as CNT, organic and metal nanoparticles, polymers, and the like (see WO 2013/070931).

A reusable damascene template suitable for use in offset printing should have the following desired characteristics: (a) achievement of equal potential on all the conductive features on the template assembly and printing surface, and (b) flat topography (i.e., a flat, planar surface) over the entire template surface used for transfer of nanoelements. Equal potential on all conductive surface features allows uniform assembly of nanomaterials. On the other hand, flat topography makes the transfer process efficient by maximizing transfer of assembled nanoelements. According to WO 2013/070931, chemical mechanical planarization/polishing (CMP) is used to achieve flat topography of template surface. Although CMP is efficient at producing a flat topography, it has limitations where printing over large areas is concerned. First, CMP must be precisely controlled to prevent defects such as "dishing" and "erosion," which lead to a non-uniform surface geometry. Also, a 100% uniform flat surface over an entire wafer cannot be achieved using CMP, since areas of non-uniform geometry around the edges are inevitable with the CMP process. This non-uniform area, known as the as the zone of edge exclusion, cannot be used for product fabrication. These defects can be more serious when the template has a large area, multi-scale patterns (mixture of macro, micro, and/or nano scale patterns), and a non-uniform pattern density.

There is a need for the development of improved methods for the fabrication of damascene templates.

SUMMARY

The technology described herein provides improved methods for fabricating damascene templates for electrophoretic assembly and transfer of patterned nanoelements. Damascene templates produced by these methods have greatly diminished non-uniformity of surface geometry as well as greatly diminished zones of edge exclusion.

Accordingly, one aspect of the present technology is a method of fabricating a damascene template for the electrophoretic assembly and transfer of patterned nanoelements. The method comprising the steps of: (a) providing a substantially planar substrate; (b) depositing an adhesion layer onto the substrate; (c) depositing a conductive metal layer onto the adhesion layer; (d) depositing a layer of lithography resist onto the conductive metal layer; (e) performing lithography to create a two-dimensional pattern of voids in the resist layer such that the surface of the conductive metal layer is exposed in the voids; (f) depositing a chromium mask layer onto the resist layer such that the voids are filled with chromium to form chromium nanostructures covering the conductive metal layer according to the above-mentioned two-dimensional pattern; (g) removing the resist layer, leaving the chromium nanostructures; (h) etching the conducive metal layer which is not covered by the chromium nanostructures, leaving raised conductive metal features in the conductive metal layer corresponding to said two-dimensional pattern; (i) depositing an insulating layer onto the surface resulting from step (h) such that the chromium nanostructures and exposed conductive metal surfaces in regions between the raised conductive metal features are covered with the insulating layer, the thickness of the insulating layer in regions between the raised conductive metal features being essentially the same as the height of the raised conductive metal features; and (j) etching to remove the chromium nanostructures and portions of the insulating layer covering the chromium nanostructures, giving rise to the damascene template. The damascene template thus produced has an essentially planar surface that includes the raised conductive metal features separated by the insulating layer. Notably, the surfaces of the raised conductive metal features and the insulating layer are essentially coplanar.

In one embodiment, the removal of the resist layer in step (g) is performed with acetone. In one embodiment, the etching in step (j) is performed using a dry etching process, e.g., ion milling.

Another aspect of the present technology is a second method of fabricating a damascene template for the electrophoretic assembly and transfer of patterned nanoelements. This method comprising the steps of: (a) providing a substantially planar substrate; (b) depositing an adhesion layer onto the substrate; (c) depositing a first conductive metal layer onto the adhesion layer; (d) depositing a layer of lithography resist onto the first conductive metal layer; (e) performing lithography to create a two-dimensional pattern of voids in the resist layer such that the surface of the conductive metal layer is exposed in the voids; (f) depositing a second conductive metal layer onto the resist layer so as to cover both the voids and residual resist layer; (g) depositing a chromium mask layer on the second conductive metal layer, such that chromium nanostructures are formed over the second conductive metal layer; (h) removing the resist layer, leaving raised conductive metal features topped with the chromium nanostructures only in the voids corresponding to the above-described two-dimensional pattern; (i) depositing an insulating layer onto the surface resulting from step (h) such that the chromium nanostructures and exposed conductive metal surfaces in regions between the raised conductive metal features are covered with the insulating layer, the thickness of the insulating layer in regions between the raised conductive metal features being essentially the same as the height of the raised conductive metal features; and (j) etching to remove the chromium nanostructures and portions of the insulating layer covering the chromium nanostructures, thereby generating the damascene template. The damascene template thus produced has an essentially planar surface that includes the raised conductive metal features separated by the insulating layer. The surfaces of the raised conductive metal features and the insulating layer are essentially coplanar. In one embodiment of this method, the first and the second conductive metal layers are made of same metal. In another embodiment, the first and the second conductive metal layers are made of different metals. In one embodiment, the metal in both the first and the second conductive metal layers is gold.

Embodiments of the above methods can include one or more of the following features. The thickness of the insulating layer in the regions between the raised conductive metal features can be within about 10%, 9%, 8%, 7%, 6%, 5%, 4%, 3%, 2%, 1%, 0.5%, 0.3%, or about 0.1% of the height of the raised conductive metal features. In some embodiments, the methods further comprise, after step (j), the step of (k) selectively silanizing the exposed surfaces of the insulating material with a hydrophobic coating of a silane compound. The silane compound can be an alkyl silane such as octadecyltrichlorosilane (OTS).

A further aspect of the present technology is a damascene template for the electrophoretic assembly and transfer of patterned nanoelements. The template includes (a) a substantially planar substrate; (b) an adhesion layer disposed on a surface of the substrate; (c) a conductive metal layer disposed on a surface of the adhesion layer opposite the substrate; and (d) an insulating layer disposed on a surface of the conductive metal layer opposite the adhesion layer.

The conductive metal layer is continuous across at least one region of the substrate, and within that region the conductive metal layer has a two-dimensional pattern that includes microscale or nanoscale raised conductive metal features such that (i) regions between the raised conductive metal features are substantially filled with the insulating layer, (ii) the thickness of the insulating layer in regions between the raised conductive metal features is essentially the same as the height of the raised conductive metal features, (iii) the raised conductive metal features are free of regions of reduced thickness, and (iv) the template is free of edge exclusion defects.

Embodiments of the damascene template can include one or more of the following features. In one embodiment, the regions of reduced thickness referred to are a result of dishing and/or erosion associated with chemical mechanical polishing. In one embodiment, the edge exclusion defect referred to is associated with chemical mechanical polishing. In one embodiment, the dishing and/or erosion defect is of the magnitude that leads to at least 5% loss in thickness in the most impacted region of any one of the raised conductive metal features. In one embodiment, the edge exclusion defect is of the magnitude that leads to at least 5% loss in thickness in the most impacted region in the edges of the damascene template. In one embodiment, the damascene template further includes a hydrophobic coating selectively disposed on exposed surfaces of the insulating layer opposite the second conductive metal layer.

In one embodiment, the substrate comprises silicon or a polymer. In various embodiments, the substrate thickness is from 1 µm to 10 µm. In one embodiment, the insulating layer includes silicon dioxide, $SiN_4$, or a polymer. In one embodiment, the thickness of adhesion layer thickness is from 5 to 500 nm. In various embodiments, the adhesion layer comprises a material selected from the group consisting of chromium, titanium, titanium dioxide, titanium nitride, tantalum, tantalum nitride, tungsten, and combinations thereof. In one embodiment, adhesion layer thickness is from 3 nm to 50 nm. In various embodiments, the conductive metal layer comprises gold, silver, tungsten, aluminum, titanium, ruthenium, copper, or a combination thereof. In various embodiments, the insulating layer includes a material selected from the group consisting of $SiO_2$, $SiN_4$, $Al_2O_3$, an organic polymer, and combinations thereof. In some embodiments, the insulating layer has a thickness from 10 nm to 10 µm. In some embodiments, the conductive metal layer comprises a planar portion having a thickness from 10 nm to 10 µm. In various embodiments, the thickness of the insulating layer in the regions between the raised conductive metal features is within about 10%, 9%, 8%, 7%, 6%, 5%, 4%, 3%, 2%, 1%, 0.5%, 0.3%, or 0.1% of the height of the raised conductive metal features. In one embodiment the hydrophobic coating on the insulating layer is a coating of silane, e.g., a monolayer of alkyl silane molecules. In one embodiment, the hydrophobic includes octadecyltrichlorosilane.

In one embodiment, the contact angle of the hydrophobic coating is from 90 to 110°. In one embodiment the raised conductive metal features include substantially linear features. These linear features can, for example, be straight, curved, intersecting, or form a circle, triangle, or rectangle. In some embodiments, the raised conductive metal features are from 10 nm to 100 µm in width. In some embodiments, the raised conductive metal features are from 10 nm to 10 cm in length. In some embodiments, the damascene template is flexible. In some embodiments, the damascene template further comprises a plurality of nanoelements non-convalently attached to exposed surfaces of the raised features such that the exposed surfaces of the insulating layer are essentially devoid of attached nanoelements. The nanoelements can be nanoparticles, single-walled carbon nanotubes, multi-walled carbon nanotubes, nanowires, nanofibers, pentacene molecules, fullerene molecules, or polymers. In some embodiments, the nanoelements are conducting, semi-conducting, or insulating.

Another aspect of the present technology is a nanoelement transfer system for transfer of patterned nanoelements by nanoimprinting. The system includes the above-described damascene template and a flexible polymer substrate for reception of the nanoelements.

Embodiments of the nanoelement transfer system can include one or more of the following features. In one embodiment, the flexible polymer substrate includes polyethylene naphthalate, polycarbonate, polystyrene, polyethylene terephthalate, polyimide, or a combination thereof. In one embodiment, the nanoelement transfer system further includes a thermally regulated imprint device for applying pressure between the damascene template and the flexible polymer substrate at a selected temperature above ambient temperature. In one embodiment, the imprint device is such that it capable of operation at a temperature higher than the glass transition temperature of the flexible polymer substrate. In one embodiment, the imprint device is such that it is capable of applying a pressure of at least 170 psi between the damascene template and the flexible polymer substrate and at a temperature of at least 160° C. In one embodiment, the flexible polymer film has a contact angle of less than about 5° and the exposed surfaces of the raised features on the damascene template have a contact angle of about 18°. In one embodiment, the flexible polymer film used is one that has been treated with oxygen plasma to render it less hydrophobic.

Aspects of the present technology further include a method of forming a patterned assembly of nanoelements on a damascene template. This method includes (a) providing the above-described damascene template; (b) submerging the damascene template in a liquid suspension of nanoelements; (c) applying a voltage between the conductive metal layer of the damascene template and a counter electrode in the liquid suspension such that nanoelements from the suspension are assembled selectively onto exposed surfaces of the raised conductive metal features of the conductive metal layer of the damascene template and not onto exposed surfaces of the insulating layer of the damascene template; (d) withdrawing the damascene template and assembly of nanoelements from the liquid suspension while continuing to apply voltage as in step (c); and (e) drying the damascene template.

Embodiments of the method of forming a patterned assembly of nanoelements nanoelement can include one or more of the following features. In one embodiment, during steps (c) and (d), the conductive metal layer of the damascene template is positive, the counter electrode is negative, and the pH of the liquid suspension is adjusted such that the nanoelements have a negative charge. In one embodiment, during during steps (c) and (d), the conductive metal layer of the damascene template is negative, the counter electrode is positive, and the pH of the liquid suspension is adjusted such that the nanoelements have a positive charge. In various embodiments, the voltage applied in steps (c) and (d) is sufficiently high to provide assembly across essentially the entire exposed surface of the raised conductive metal features of the conductive metal layer of the damascene template. In one embodiment, the speed of withdrawing the damascene template in step (d) is sufficiently slow to retain the patterned assembly of nanoelements on the surface of the raised features of the conductive metal layer of the damascene template through the withdrawal process. In one embodiment, the voltage in steps (c) and (d) is in the range from 1.5 to 7 V and the speed of withdrawing in step (d) is in the range from 1 to 15 mm/min.

Yet another aspect of the present technology is a method of assembling and transferring a two-dimensional patterned assembly of nanoelements onto a flexible polymer substrate. This method includes the steps of: (a) providing the above-described nanoelement transfer system and a liquid suspension of nanoelements; (b) performing electrophoretic assembly of nanoelements from the liquid suspension according to the above-described method to yield a patterned assembly of nanoelements on the damascene template; (c) contacting the patterned assembly of nanoelements with the flexible polymer substrate and applying pressure, resulting in the patterned assembly of nanoelements being transferred onto the flexible patterned substrate. In this method, step (c) is performed at a temperature above the glass transition temperature of the flexible polymer substrate.

The present technology can be further summarized by the following listing of embodiments:

1. A method of fabricating a damascene template for the electrophoretic assembly and transfer of patterned nanoelements, the method comprising the steps of:
   (a) providing a substantially planar substrate;
   (b) depositing an adhesion layer onto the substrate;
   (c) depositing a conductive metal layer onto the adhesion layer;
   (d) depositing a layer of lithography resist onto the conductive metal layer;
   (e) performing lithography to create a two-dimensional pattern of voids in the resist layer, whereby the surface of the conductive metal layer is exposed in the voids;
   (f) depositing a chromium mask layer onto the resist layer, whereby the voids are filled with chromium to form chromium nanostructures covering the conductive metal layer according to said two-dimensional pattern;
   (g) removing the resist layer, leaving the chromium nanostructures;
   (h) etching the conductive metal layer which is not covered by the chromium nanostructures, leaving raised conductive metal features in the conductive metal layer corresponding to said two-dimensional pattern;
   (i) depositing an insulating layer onto the surface resulting from step (h), whereby the chromium nanostructures and exposed conductive metal surfaces in regions between the raised conductive metal features are covered with the insulating layer, wherein the thickness of the insulating layer in regions between the raised conductive metal features is essentially the same as the height of the raised conductive metal features; and
   (j) etching to remove the chromium nanostructures and portions of the insulating layer covering the chromium nanostructures, leaving said damascene template, wherein the damascene template has an essentially planar surface comprising said raised conductive metal features separated by said insulating layer, and wherein surfaces of the raised conductive metal features and the insulating layer are essentially coplanar.
2. The method of embodiment 1, wherein removal of the resist layer in step (g) is performed by dissolving the resist in a solvent, such as acetone.
3. The method of embodiment 1 or 2, wherein the etching in step (h) is performed by ion milling.

4. A method of fabricating a damascene template for the electrophoretic assembly and transfer of patterned nanoelements, the method comprising the steps of:
   (a) providing a substantially planar substrate;
   (b) depositing an adhesion layer onto the substrate;
   (c) depositing a first conductive metal layer onto the adhesion layer;
   (d) depositing a layer of lithography resist onto the first conductive metal layer;
   (e) performing lithography to create a two-dimensional pattern of voids in the resist layer, whereby the surface of the conductive metal layer is exposed in the voids;
   (f) depositing a second conductive metal layer onto the resist layer so as to cover both the voids and residual resist layer;
   (g) depositing a chromium mask layer on the second conductive metal layer, whereby chromium nanostructures are formed over the second conductive metal layer;
   (h) removing the resist layer, leaving raised conductive metal features topped with the chromium nanostructures only in the voids corresponding to said two-dimensional pattern;
   (i) depositing an insulating layer onto the surface resulting from step (h), whereby the chromium nanostructures and exposed conductive metal surfaces in regions between the raised conductive metal features are covered with the insulating layer, wherein the thickness of the insulating layer in regions between the raised conductive metal features is essentially the same as the height of the raised conductive metal features; and
   (j) etching to remove the chromium nanostructures and portions of the insulating layer covering the chromium nanostructures, leaving said damascene template, wherein the damascene template has an essentially planar surface comprising said raised conductive metal features separated by said insulating layer, and wherein surfaces of the raised conductive metal features and the insulating layer are essentially coplanar.
5. The method of embodiment 4, wherein the second conductive metal layer consists of the same conductive metal as the first layer.
6. The method of embodiment 4 or 5, wherein removal of the resist layer in step (h) is performed by dissolving the resist in a solvent, such as acetone.
7. The method of any of the preceding embodiments, wherein the thickness of the insulating layer in the regions between the raised conductive metal features is within about 5%, preferably within about 2%, of the height of the raised conductive metal features.
8. The method of any of the preceding embodiments, wherein the resulting damascene template is essentially free of dishing and erosion defects.
9. The method of any of the preceding embodiments, wherein the method does not comprise the use of chemo-mechanical polishing.
10. The method of any of the preceding embodiments, wherein the insulating layer comprises silicon dioxide, and further comprising, after step (j):
    (k) silanizing exposed surfaces of the insulating layer with a hydrophobic silane compound.
11. The method of embodiment 10, wherein the silane compound is an alkyl silane, such as octadecyltrichlorosilane (OTS).
12. The method of any of the preceding embodiments, wherein the etching of step (j) comprises the use of sonication.
13. A damascene template for the electrophoretic assembly and transfer of patterned nanoelements, the template comprising:
    a substrate having a substantially planar surface;
    an adhesion layer disposed on said substrate surface;
    a conductive metal layer disposed on a surface of the adhesion layer opposite the substrate; and
    an insulating layer disposed on a surface of the conductive metal layer opposite the adhesion layer;
    wherein the conductive metal layer is continuous across at least one region of the substrate, and within said region the conductive metal layer has a two-dimensional pattern comprising microscale or nanoscale raised conductive metal features;
    wherein regions between the raised conductive metal features are substantially filled with the insulating layer;
    wherein the thickness of the insulating layer in regions between the raised conductive metal features is essentially the same as the height of the raised conductive metal features, such that the exposed surfaces of the raised conductive metal features and the insulating layer are essentially co-planar; and
    wherein the damascene template is essentially free of dishing defects, erosion defects, and edge exclusion defects.
14. The damascene template of embodiment 13 that was fabricated by the method of any of embodiments 1-12.
15. The damascene template of embodiment 13 or 14, wherein the thickness of the raised conductive metal features and the height of the insulating layer in regions between the raised conductive metal features differ by less than 5%, preferably by less than 2%.
16. The damascene template of any of embodiments 13-15, wherein the exposed surface of the template comprising said raised conductive metal features and said insulating layer in regions between the raised conductive metal features deviates from planarity by less than 100 nm, preferably less than 20 nm, more preferably less than 5 nm.
17. The damascene template of any of embodiments 13-16, further comprising a hydrophobic coating selectively disposed on exposed surfaces of the insulating layer.
18. The damascene template of embodiment 17, wherein the hydrophobic coating comprises a monolayer of alkyl silane molecules, such as octadecyltrichlorosilane.
19. The damascene template of embodiment 17 or 18, wherein the contact angle of the hydrophobic coating is from 90° to 110°.
20. The damascene template of any of embodiments 13-19, wherein the substrate comprises silicon or a polymer.
21. The damascene template of any of embodiments 13-20, wherein the substrate is flexible, preferably wherein the damascene template is flexible.
22. The damascene template of any of embodiments 13-21, wherein the insulating layer comprises silicon dioxide, $SiN_4$, $Al_2O_3$, or a nonconductive polymer.
23. The damascene template of any of embodiments 13-22, wherein insulating layer thickness is from 5 to 500 nm.
24. The damascene template of any of embodiments 13-23, wherein the adhesion layer comprises a material selected from the group consisting of chromium, titanium, titanium dioxide, titanium nitride, tantalum, tantalum nitride, tungsten, and combinations thereof.
25. The damascene template of any of embodiments 13-24, wherein adhesion layer thickness is from 3 nm to 50 nm.

26. The damascene template of any of embodiments 13-25, wherein conductive metal layer comprises gold, silver, tungsten, aluminum, titanium, ruthenium, copper, or a combination thereof.

27. The damascene template of any of embodiments 13-26, wherein the insulating layer comprises a material selected from the group consisting of $SiO_2$, $SiN_4$, $Al_2O_3$, an organic polymer, and combinations thereof.

28. The damascene template of any of embodiments 13-27, wherein the conductive metal layer comprises a planar portion having a thickness from 10 nm to 10 µm.

29. The damascene template of any of embodiments 13-28, wherein the raised features comprise substantially linear features, preferably linear features which are straight, curved, intersecting, or form a circle, triangle, rectangle, or other geometric figure.

30. The damascene template of any of embodiments 13-29, wherein the raised conductive metal features are from 10 nm to 100 µm in width.

31. The damascene template of any of embodiments 13-30, wherein the raised conductive metal features are from 10 nm to 10 cm in length.

32. The damascene template of any of embodiments 13-31, further comprising a plurality of nanoelements non-covalently or covalently attached to exposed surfaces of the raised conductive features, wherein the exposed surfaces of the insulating layer are essentially devoid of attached nanoelements.

33. The damascene template of embodiment 32, wherein the nanoelements are nanoparticles, single-walled carbon nanotubes, multi-walled carbon nanotubes, nanowires, nanofibers, pentacene molecules, fullerene molecules, or polymers.

34. The damascene template of any of embodiments 13-33, wherein the nanoelements are conducting, semi-conducting, or insulating.

35. A nanoelement transfer system for transfer of patterned nanoelements by nanoimprinting, the system comprising the damascene template of any of embodiments 13-34 and a flexible polymer substrate for reception of said plurality of nanoelements.

36. The nanoelement transfer system of embodiment 35, wherein the flexible polymer substrate comprises polyethylene naphthalate, polycarbonate, polystyrene, polyethylene terephthalate, polyimide, or a combination thereof.

37. The nanoelement transfer system of embodiment 35 or 36, further comprising a thermally regulated imprint device for applying pressure between the damascene template and the flexible polymer substrate at a selected temperature above ambient temperature.

38. The nanoelement transfer system of any of embodiments 37, wherein the imprint device is capable of operation at a temperature higher than the glass transition temperature of the flexible polymer substrate.

39. The nanoelement transfer system of embodiment 37 or 38, wherein the imprint device is capable of applying a pressure of at least 170 psi between the damascene template and the flexible polymer substrate and at a temperature of at least 160° C.

40. The nanoelement transfer system of any of embodiments 35-39, wherein the flexible polymer film has a contact angle of less than about 5° and the exposed surfaces of the raised features on the damascene template have a contact angle of about 18°.

41. The nanoelement transfer system of any of embodiments 35-40, wherein the flexible polymer film has been treated with an oxygen plasma to render it less hydrophobic.

42. A method of forming a patterned assembly of nanoelements on a damascene template, the method comprising the steps of:
(a) providing the damascene template of any of embodiments 13-31;
(b) submerging the damascene template in a liquid suspension of nanoelements;
(c) applying a voltage between the conductive metal layer of the damascene template and a counter electrode in the liquid suspension, whereby nanoelements from the suspension are assembled selectively onto exposed surfaces of the raised conductive metal features of the conductive metal layer of the damascene template and not onto exposed surfaces of the insulating layer of the damascene template;
(d) withdrawing the damascene template and assembly of nanoelements from the liquid suspension while continuing to apply voltage as in step (c); and
(e) drying the damascene template.

43. The method of embodiment 42, wherein during steps (c) and (d) the conductive metal layer of the damascene template is positive, the counter electrode is negative, and the pH of the liquid suspension is adjusted such that the nanoelements have a negative charge.

44. The method of embodiment 42, wherein during steps (c) and (d) the conductive metal layer of the damascene template is negative, the counter electrode is positive, and the pH of the liquid suspension is adjusted such that the nanoelements have a positive charge.

45. The method of any of embodiments 42-44, wherein the voltage applied in steps (c) and (d) is sufficiently high to provide assembly across essentially the entire exposed surface of the raised conductive metal features of the conductive metal layer of the damascene template.

46. The method of any of embodiments 42-45, wherein the speed of withdrawing the damascene template in step (d) is sufficiently slow to retain the patterned assembly of nanoelements on the surface of the raised features of the conductive metal layer of the damascene template through the withdrawal process.

47. The method of any of embodiments 42-46, wherein the voltage in steps (c) and (d) is in the range from 1.5 to 7 V and the speed of withdrawing in step (d) is in the range from 1 to 15 mm/min.

48. A method of assembling and transferring a two-dimensional patterned assembly of nanoelements onto a flexible polymer substrate, the method comprising the steps of:
(a) providing the nanoelement transfer system of any of embodiments 35-41 and a liquid suspension of nanoelements;
(b) performing electrophoretic assembly of nanoelements from the liquid suspension according to the method of any of embodiments 42-47 to yield a patterned assembly of nanoelements on the damascene template;
(c) contacting the patterned assembly of nanoelements with the flexible polymer substrate and applying pressure, whereby the patterned assembly of nanoelements is transferred onto the flexible patterned substrate;
wherein step (c) is performed at a temperature above the glass transition temperature of the flexible polymer substrate.

49. The method of embodiment 48, comprising performing steps (b) and (c) for two or more cycles, each cycle depositing a fresh patterned assembly of nanoelements onto a fresh flexible polymer substrate.

BRIEF DESCRIPTION OF THE DRAWINGS

FIG. 4A shows damascene templates having conductive features that are recessed (left), co-planar with the interspersed insulating layer (middle), or protruding above the insulating layer (right). FIG. 4B shows the typical results of nanoelement transfer damascene templates shown in FIG. 4A.

FIG. 5A shows the pressure distribution across a wafer surface during CMP. FIG. 5B shows a zone of edge exclusion caused by different polishing rates in different parts of a wafer during CMP.

In FIG. 7A, a thick Cr mask layer leaves residue of the silicon dioxide insulating layer when the mask and excess insulating layer are lifted off with the aid of sonication. The result of an experiment is shown at the right as an atomic force microscopy (AFM) image and scan of the image. FIG. 7B shows an optimal result (flat template surface) obtained with an appropriately thick Cr mask layer.

DETAILED DESCRIPTION

Figure 1:
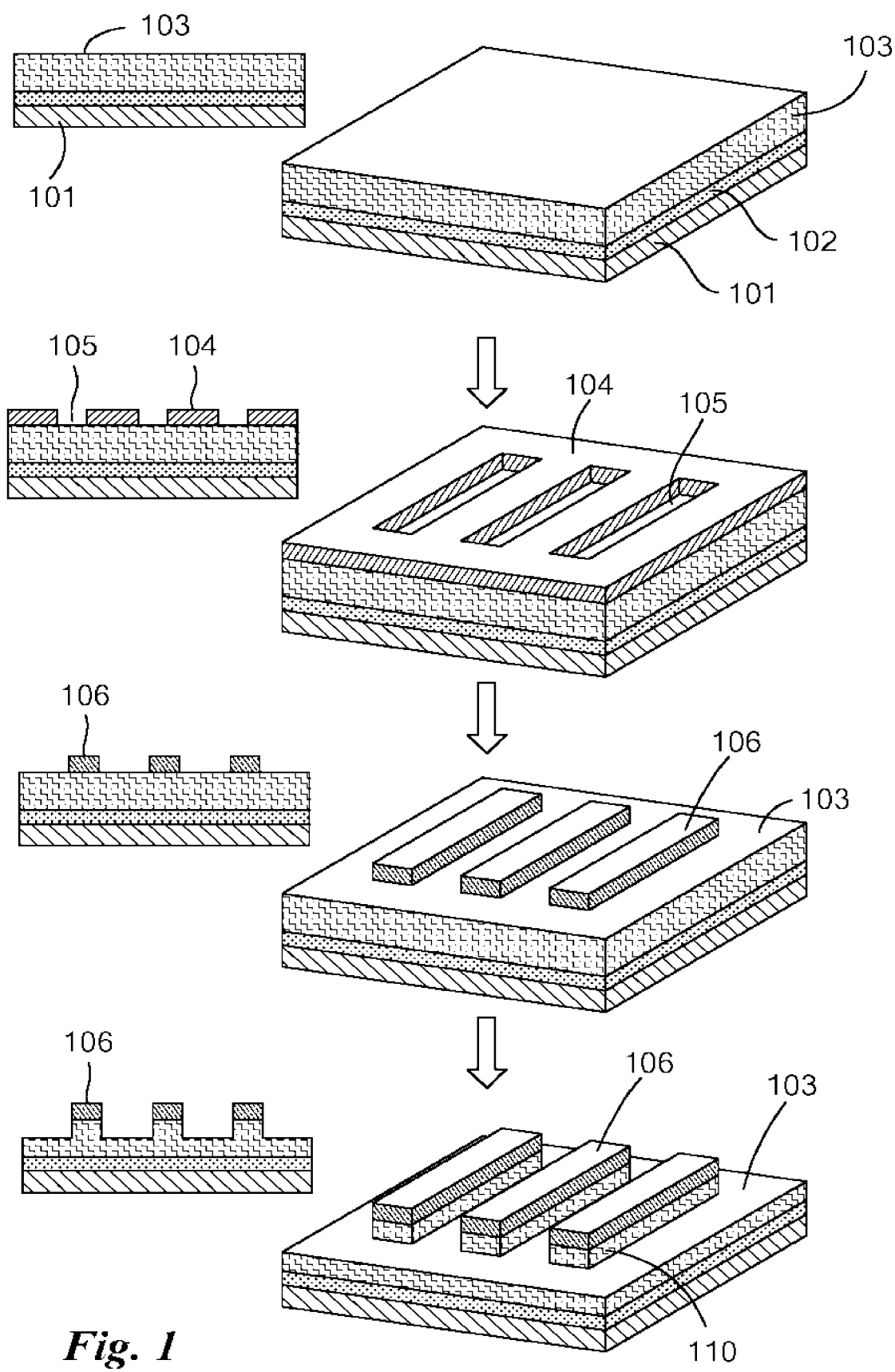
FIG. 1 is a schematic diagram of one embodiment of a damascene template fabrication process according to the present technology. In this process, a combination of lithography and etching using ion milling is used to produce raised conductive metal features.
Figure 1:
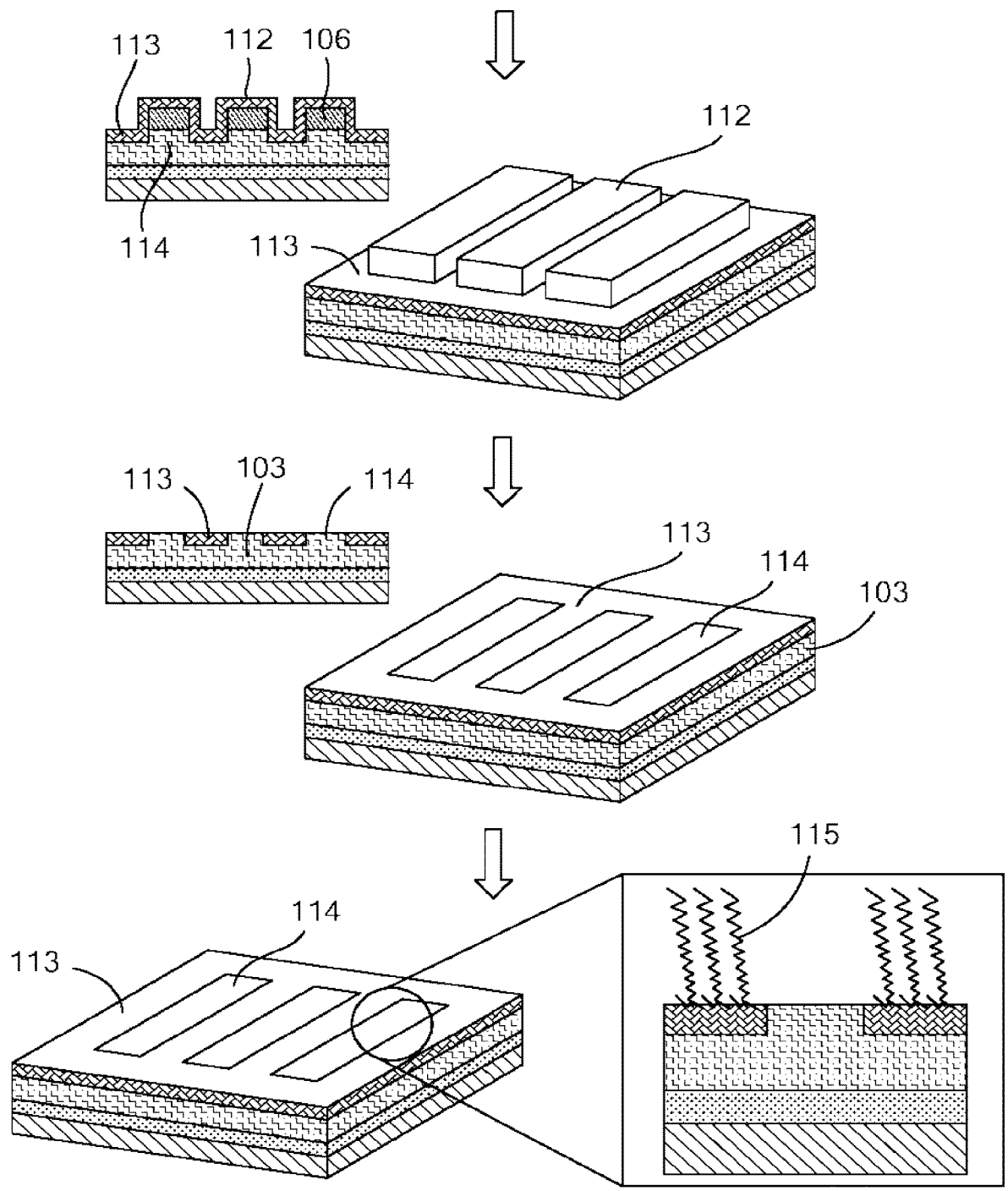
Figure 2:
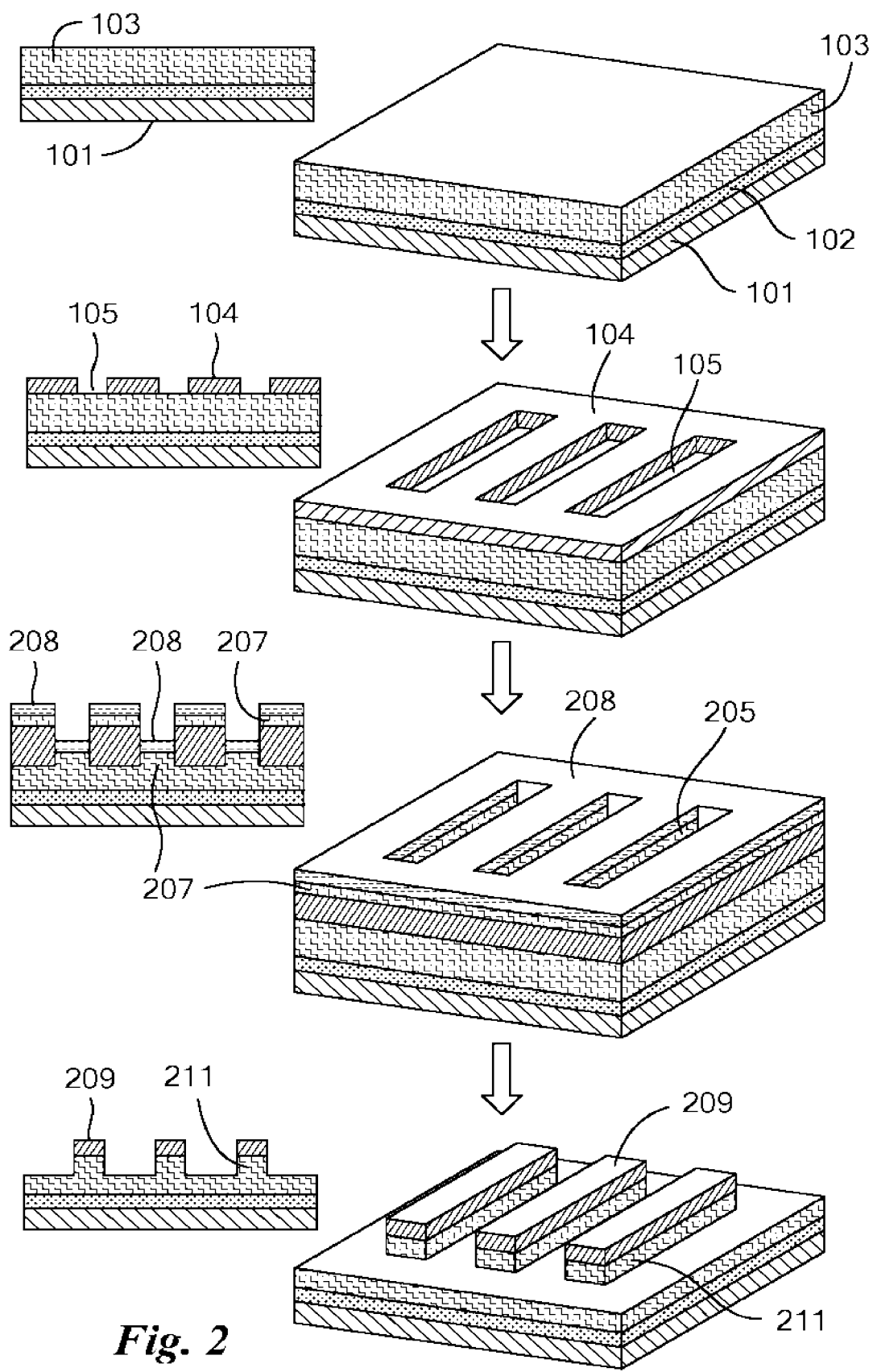
FIG. 2 is a schematic diagram of another embodiment of a damascene template fabrication process according to the present technology. In this process, raised conductive metal features are produced by a combination of lithography and conductive metal layer deposition.
Figure 2:
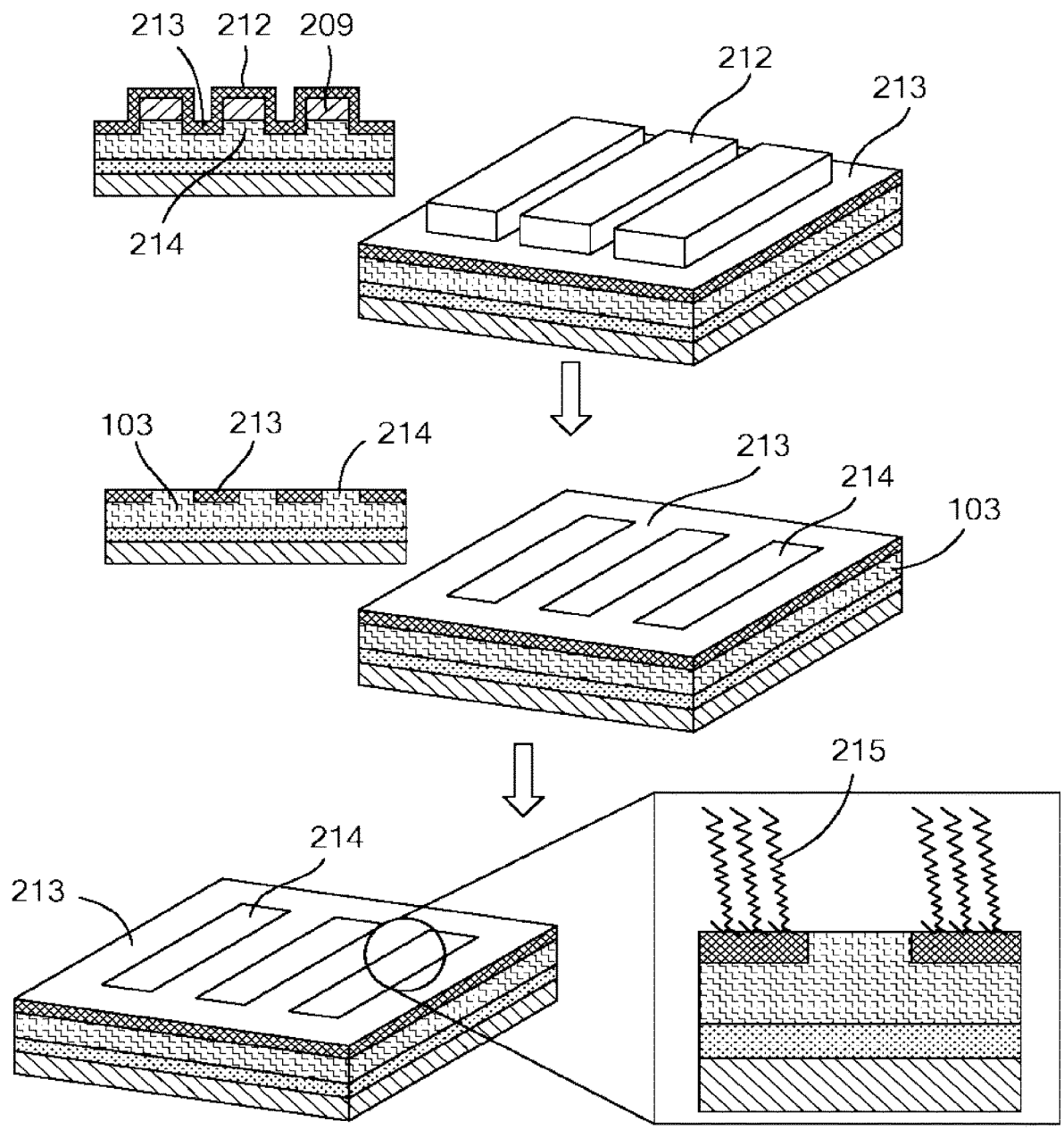

Methods for fabrication of damascene templates for the electrophoretic assembly and transfer of patterned nanoelements are provided that overcome limitations of current fabrication methods which utilize chemical mechanical polishing (CMP). Instead of using CMP to produce a highly planar template, whose surface contains a co-planar mixture of conductive features filled in by an insulating material, the present technology uses high precision lithography to produce raised conductive features and an interspersed insulating layer of equal height, resulting in a planar surface. The technology utilizes two alternative methods to fabricate damascene templates. One method uses etching of the conductive layer by ion milling to create a two-dimensional pattern of raised conductive features (FIG. 1). The other method uses lithography to build up a conductive layer in two stages, the second of which creates the two-dimensional pattern of raised conductive features (FIG. 2). Both methods utilize chromium masks to create the pattern of raised conductive features followed by chromium etching.

The damascene fabrication methods of the present technology are designed to fulfill two objectives: (1) to achieve equal electric potential on all the conductive features regardless of size, shape, density or position on the template, and (2) maximal flatness over the entire damascene template surface. Both characteristics are important for achieving efficiency and evenness of nanoelement transfer in an offset printing process. Equal potential on all of the nano, micro, and/or macro scale conductive features is obtained by connecting the features with a conductive film underneath an insulating layer. A flat template surface is achieved using highly controlled and precise chip fabrication processes (i.e., matching the height or thickness of the raised conductive features and the interspersed insulating layer).

Figure 3A:
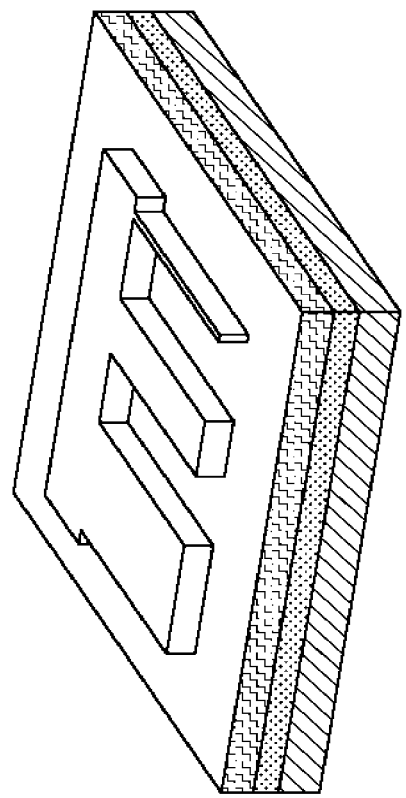
FIGS. 3A and 3B show two different strategies for creating templates for nanoelement and transfer. In the strategy depicted in FIG. 3A, the metal conductive elements protrude above an insulating layer, which gives rise to a non-uniform electric field and leaves the conductive features susceptible to breaking off during use. In the strategy depicted in FIG. 3B, and used in the present technology, the raised metal features are connected through a metal film underneath the insulating layer, which gives rise to a uniform electric field, and the integration of the raised conductive features with the insulating layer stabilizes the conductive features against break-off.
Figure 3A:
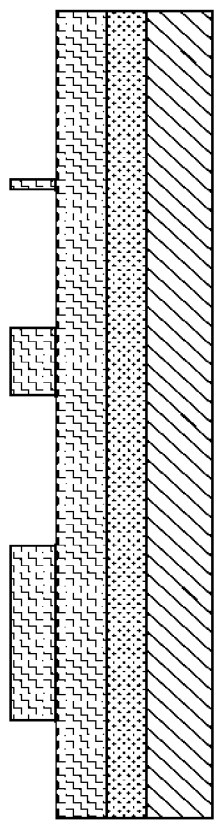
Figure 3B:
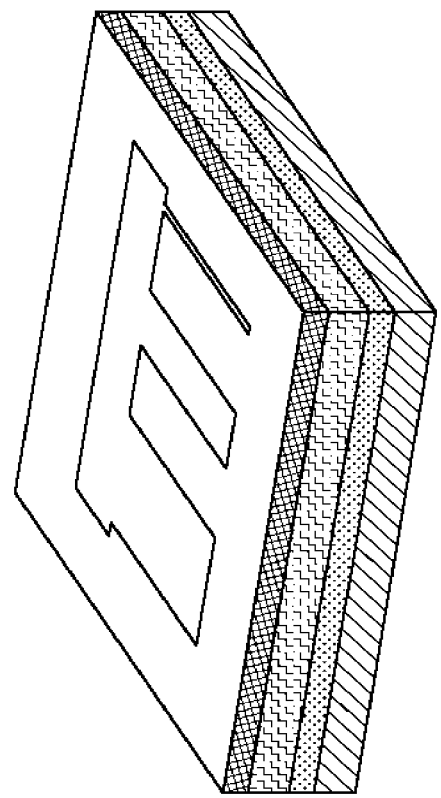
Figure 3B:
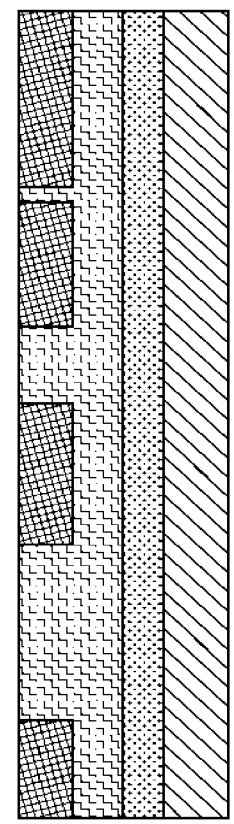

Uniform assembly of nanomaterials is generally carried out using a uniform electric field. However, when the conductive features on a template for electrophoretic assembly and transfer are of different scale, the potential significantly drops at the smaller-scale features even if all the features are connected to each other. Also, there is a risk of peeling off of the conductive features due to poor adhesion to the substrate. Connecting the conductive features by a metal film underneath an insulating layer, as described below, allows uniform potential regardless of feature size (compare FIGS. 3A, 3B). At the same time, it strengthens the conductive features such that they are not peeled off from the template during transfer.

The damascene template of the present technology is designed to have flat topography over the whole surface of the template, including both surfaces of the conductive patterns and those of regions between the conducting patterns, i.e., the insulating regions. A flat topography is useful for achieving both uniform assembly of nanomaterials and high efficiency of transfer of nanomaterials. The present technology uses precisely controlled etching of metal layers and deposition of insulating layer to achieve flat topography.

Figures 4A, 4B:
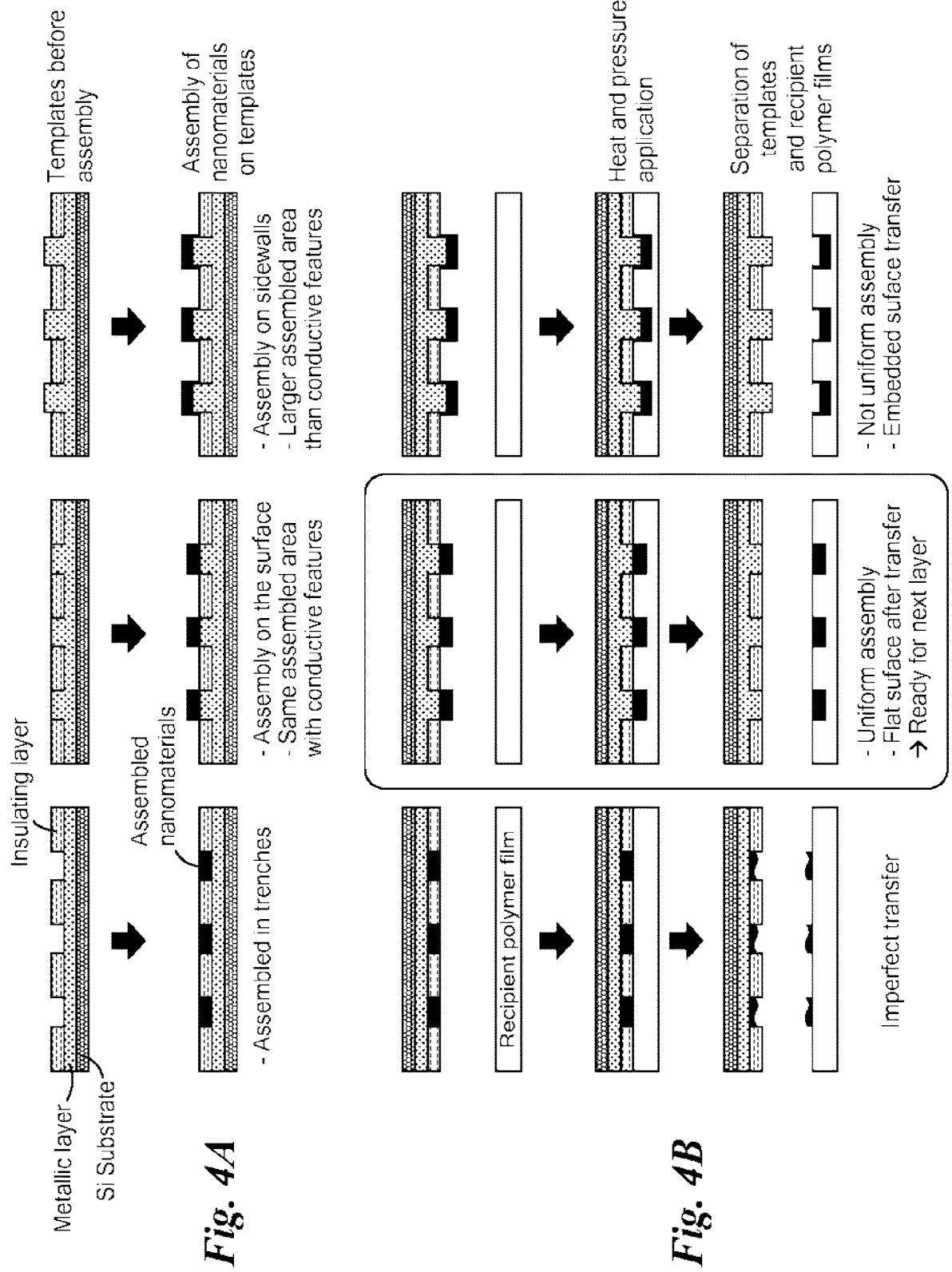
FIGS. 4A and 4B are schematic diagrams that illustrate how using a damascene template having a flat surface gives rise to more complete and more uniform nanoelement transfer.

FIGS. 4A and 4B illustrate why a template surface with flat surface is advantageous in an assembly and transfer process. FIG. 4A shows damascene templates assembled with either flat (middle) or non-flat (left and right) surfaces. Note that before assembly, in the template on the left the insulating regions project outwards, whereas in the template on the right the conductive features project outwards. FIG. 4A also shows the various templates with assembled nanoelements. FIG. 4B depicts the results of transfer using each of the three templates. The template with flat topography (middle) is expected to result in a perfect transfer and ready to be used in the next transfer. The template on the left is expected to result in imperfect transfer and not expected to be ready to be used in the next transfer without extensive cleaning to remove adherent nanoelements. The template on the right is expected to lead to imperfect transfer due to nanoelements that adhere to the sides of the raised conductive features during assembly.

Available methods of transferring nanomaterials through printing using a template sacrificial layer and intermediate sacrificial films cannot be reused and require additional fabrication steps leading to higher production costs.[14-16] Transfer printing using damascene template can be used for fabricating microscale and nanoscale structures, including combinations of microscale and nanoscale structures on a single chip, without the need for an intermediate film.[17-18] A damascene template allows electrophoretic assembly of nanomaterials only on the conductive patterns, not on the insulating layer. However, this demarcation is not total. In order to further ensure selective assembly of nanomaterials only on the conductive features, the technology described herein includes reducing the surface energy of the insulating region to prevent the assembly of nanomaterials in these regions. Surface energy of the insulating regions can be reduced using self-assembled monolayers (SAM) without affecting the surface energy of the conductive features. A silane compound with a long chain can be selectively reacted with a $SiO_2$ (insulating) surface in order to change the surface energy from hydrophilic to hydrophobic without affecting the surface energy of the conductive features. For example, octadecyltrichlorosilane (OTS) or similar compounds (e.g., varying the alkyl chain length) may be used to form the SAM for making the $SiO_2$ surface hydrophobic. SAM, selectively formed only on the insulating area, enhances directed assembly on conductive features, transfer of nanomaterials with high efficiency, and further allows the damascene template to be reused.

Figure 5A:
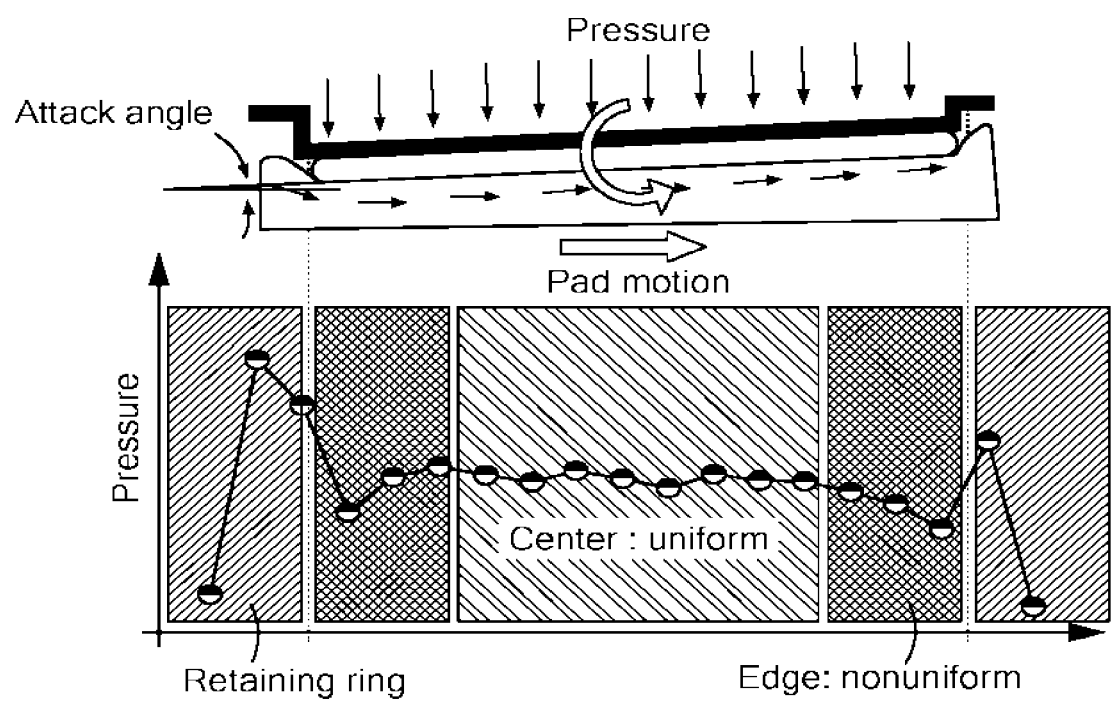
FIGS. 5A and 5B are schematic depictions of non-uniform surface geometry typically observed near a wafer edge during (5A) and following (5B) a chemical mechanical polishing (CMP) process. See H. Jeong et al., *Int. J. Precis. Eng. Man.*, 2013, V14, pp 11-15.
Figure 5B:
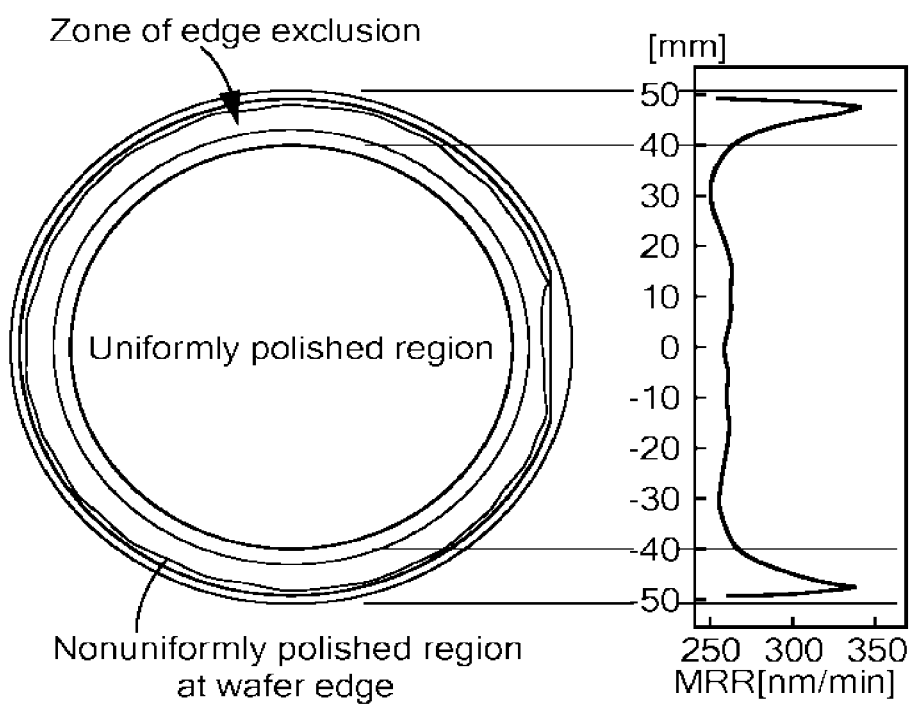
Figure 6:
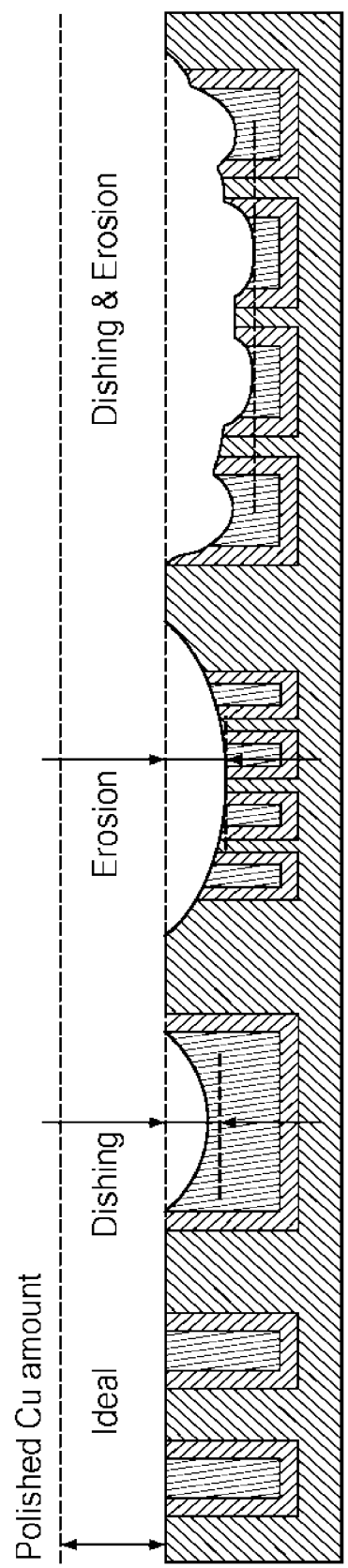
FIG. 6 is a schematic depiction of the results of dishing and erosion defects resulting from CMP.

Fabrication of a damascene template according to the present technology results in a template with a flat and uniform surface without the use of CMP. Although CMP is currently used to obtain uniform surface features, it is not suitable when the template is of the scale of a typical wafer or larger. CMP makes a smooth surface possible, but with CMP it is not possible to obtain a uniform flat surface over the entire wafer from edge to edge due to intrinsic limitations of the basic polishing mechanism.[22] With use of CMP, the polishing rates between the wafer center and the area near the wafer edge are significantly different, resulting in non-uniform geometry. See FIGS. 5A and 5B. The non-uniform geometry decreases the efficiency of both assembly and transfer. Thus, reliance on CMP limits the template size to only a portion of the size of a wafer, while high productivity requires that the template be much larger even than an entire wafer. Another drawback of the CMP process is that it can lead to "dishing" and "erosion" defects which lead to a nonuniform geometry near the conductive features. See FIG. 6. These defects are caused by different polishing rates achieved with different materials (e.g., insulating vs. conducting). The difference can be more significant when the template has a multi-scale pattern (i.e., more than one of macro, micro, and nano scale features) and a non-uniform pattern density.

The fabrication of damascene templates according to the present technology is described in greater detail in the following. In one embodiment of the fabrication method, shown in FIG. 1, a conductive metallic layer 103 (e.g., Au, Ni, or W) is first deposited on a substrate 101, e.g., a silicon wafer. Evaporation or sputtering may be used for depositing the metallic layer. Depending on the specific metal used, an adhesive layer 102, made of Cr, Ti, or Ni, is deposited between the metallic layer 103 and the substrate 101. A resist layer 104 (e.g. PMMA), suitable for lithography, is deposited over the metallic layer. Next, a two-dimensional pattern of voids 105 is produced in the resist layer using lithography such that the surface of the conductive metal layer is exposed in the voids. Electron beam lithography may be used to produce this two-dimensional pattern of voids. Subsequently, a thin mask of chromium nanostructures 106 of a desired pattern is formed on the metallic layer 103. To obtain the chromium nanostructures, a layer of chromium is deposited over the resist layer 104. In the voids 105, the chromium layer comes into contact with the conductive metal layer. The chromium layer is then selectively removed from regions having the resist layer (i.e., from regions excluding the voids 105). Next, the conductive metal regions exposed as a result of the chromium layer removal are partially etched using a dry-etching process, such as ion milling. The etching leaves behind raised conductive metal features 110 in the conductive metal layer. These raised metal features correspond to the above-described two-dimensional pattern of voids produced by lithography. Their surfaces are covered by the chromium nanostructures 106. In the next step, an insulating layer 112, e.g., a $SiO_2$ film, is deposited over the entire template, causing both the chromium nanostructures and the exposed conductive metal surfaces in regions between the raised conductive metal features to be covered with the insulating layer. The deposition may be performed using Plasma enhanced chemical vaporized deposition (PECVD). It should be noted that the insulating layer deposition is carried out in a highly controlled fashion such that the thickness of the insulating layer in the regions between the raised conductive metal features, indicated by the reference numeral 113, is essentially the same as the height of the raised conductive metal features 114. Finally, the chromium nanostructures 106 are removed using a liquid etchant, accompanied optionally with sonication, resulting in formation of the damascene template.

Another embodiment of the fabrication method is shown in FIG. 2. In this embodiment as well, initially a conductive metallic layer 103 is deposited on a substrate 101. An adhesive layer 102 is optionally deposited between the metallic layer 103 and the substrate 101. Next, a resist layer 104 suitable for lithography is deposited over the metallic layer. As in the embodiment above, lithography is performed to produce a two-dimensional pattern of voids 105. In these voids, the conductive metal layer is exposed. Subsequently, a second conductive metal layer 207 is deposited onto the resist layer so as to cover both the voids and residual resist layer. A chromium layer is next deposited on the second conductive metal layer, whereby chromium nanostructures 208 are formed over the second conductive metal layer 207, both in the voids 105 and in the regions between the voids. Reference numeral 205 depicts the conductive metal layer forming the walls of the voids, the base of the voids being by chromium. In the next step, the resist layer is removed, which leaves behind raised conductive metal features 211, topped with chromium nanostructures 209, only in the voids. These raised metal features correspond to the two-dimensional pattern of voids produced by lithography. Next, as in the embodiment described above, an insulating layer 212 is deposited over the entire template to cover both the chromium nanostructures 209 and the exposed conductive metal surfaces in regions between the raised conductive metal features. Again, deposition is carried out in a highly controlled fashion such that the thickness of the insulating layer in the regions between the raised conductive metal features, reference numeral 113, is essentially the same as the height of the raised conductive metal features 214. In the final step, the chromium nanostructures 209 are removed using a liquid etchant, accompanied optionally with sonication, thereby resulting in the damascene template.

The damascene template produced by each of the above-described fabrication methods has an essentially planar surface, includes raised conductive metal features 114/214 separated by said insulating layer 113/213. Further, the raised features generally protrude at a 90° angle above the plane of the rest of the metallic conductive layer, and the surfaces of the raised conductive metal features and the insulating layer in the damascene template are essentially coplanar.

Figure 7A:
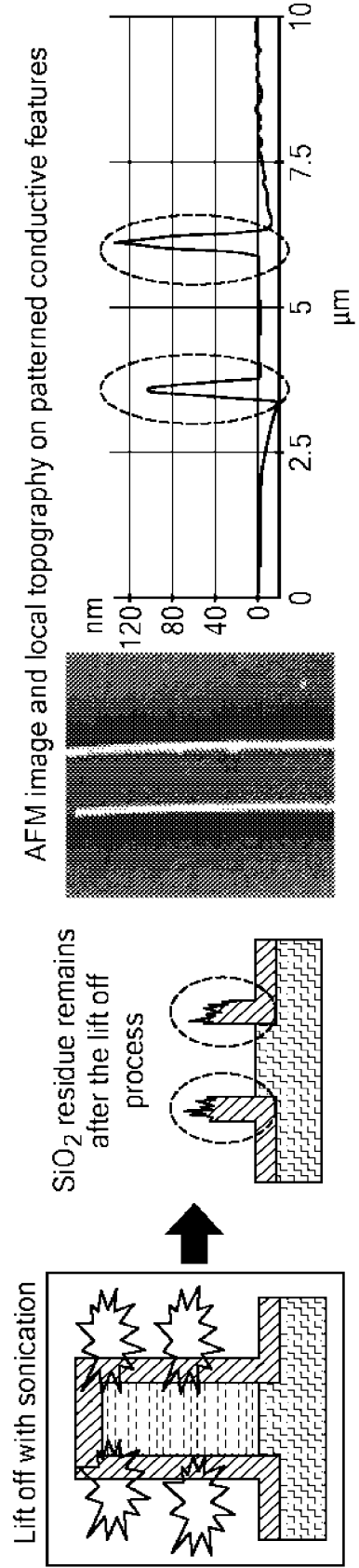
FIGS. 7A and 7B are schematic representations depicting the effect of thickness of the chromium mask layer in a fabrication process for a damascene template.
Figure 7B:
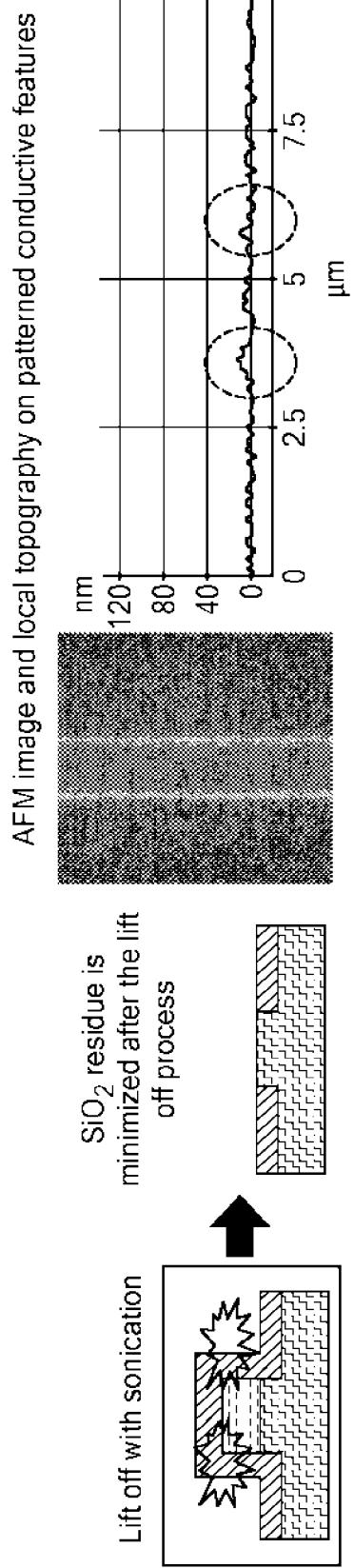

In the methods above, a flawless lift off, i.e., perfect removal of the chromium nanostructures, requires that thickness of the chromium layer deposited on the metallic be optimum. If the chromium layer is thick, the insulating material cannot be removed completely during lift off, resulting in some of the material remaining as residues on the edges of conductive features. This is apparent from FIG. 7A, showing lift off with sonication. Some of the insulating material, $SiO_2$, is seen remaining attached to the raised conductive metal features. On the other hand, if the chromium layer is optimized to be thin, the insulating material can be removed completely, resulting in a smooth surface or a flat topography on the template surface (FIG. 7B, left). In various embodiments, the thickness of the chromium layer can be, for example, from 2 nm to 25 nm, or from 1 nm to 15 nm, or from 1 nm to 10 nm, or from 5 nm to 30 nm, or from 20 nm to 50 nm, or from 30 nm to 100 nm. Surface topography was measured for both thick and thin chromium layer using atomic force microscopy (AFM) and compared (FIGS. 7A and 7B, right).

As previously described, a self-assembled monolayer (SAM) selectively formed on the insulating area enhances both directed assembly of the nanomaterials on the conductive features and efficiency of transfer of the nanomaterials (115/215 in FIGS. 1 and 2). Efficient transfer allows the damascene template to be reused. An embodiment of the technology uses OTS to selectively form a hydrophobic surface on the $SiO_2$ regions of the template. To form an OTS SAM on the $SiO_2$ surface, a template made according to the described methods was pre-cleaned for 3 min with a freshly prepared piranha solution (sulfuric acid:hydrogen peroxide=2:1). The template was rinsed under the running deionized water (DIW) for 5 min and dried with a stream of nitrogen. OTS-SAM was formed by immersing the damascene template into a toluene solution containing 1.4 vol. % OTS for 2 min. Next, the template was rinsed with toluene to remove physically adsorbed OTS on the gold surface, followed by drying with a stream of nitrogen. OTS-SAM is non-covalently attached to the gold surface. To completely remove OTS-SAM from the conductive features (Au), the template was again immersed in piranha solution for a short period, rinsed, and dried with nitrogen.

Transfer printing onto recipient substrates can enable the production of various types of new devices including thin-film transistors, gas sensors, and biosensors.[19-21] A flexible enzymatic biosensor and a printed nanoscale metal circuit on flexible substrate are shown below as examples of applications of the present technology.

Figure 8:
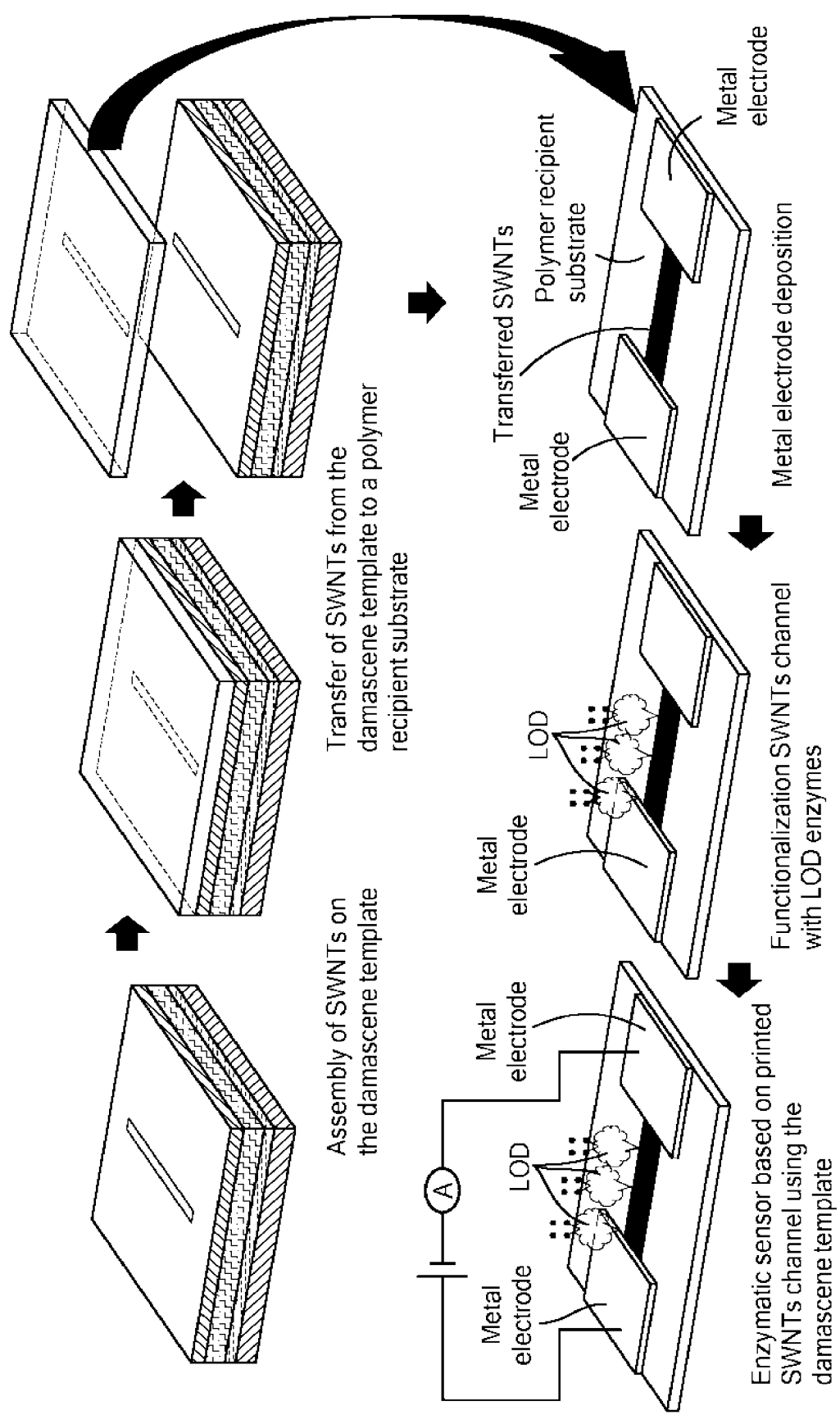
FIG. 8 schematically depicts an embodiment of a nanoelement assembly and transfer process used to prepare a biosensor for detecting lactate. The damascene template is used to assemble a strip of single-walled carbon nanotubes (SWNT), which is transferred onto a flexible polymer substrate, followed by fabrication of electrodes contacting the SWNT strip and functionalization of the SWNT using lactate oxidase-coupled nanoparticles and a linker.

The damascene template produced according to the present technology can be used to fabricate a sensor using nanomaterials such as CNT, $MoS_2$, and organic nanoparticles. Accordingly, an enzymatic lactate sensor is developed using a single walled carbon nanotube (SWNT) strip or channel functionalized by the enzyme lactate oxidase (LOD). See FIG. 8. The enzyme reacts only with lactate, thereby allowing the SWNT channel to specifically detect a lactate signal. SWNTs are assembled on the damascene template and then transferred to a polymer recipient substrate, such as a polyester (e.g., PET) film. Subsequently metal electrodes are deposited on the assembled SWNT channel, and the channel functionalized with the enzyme.

Figure 9:
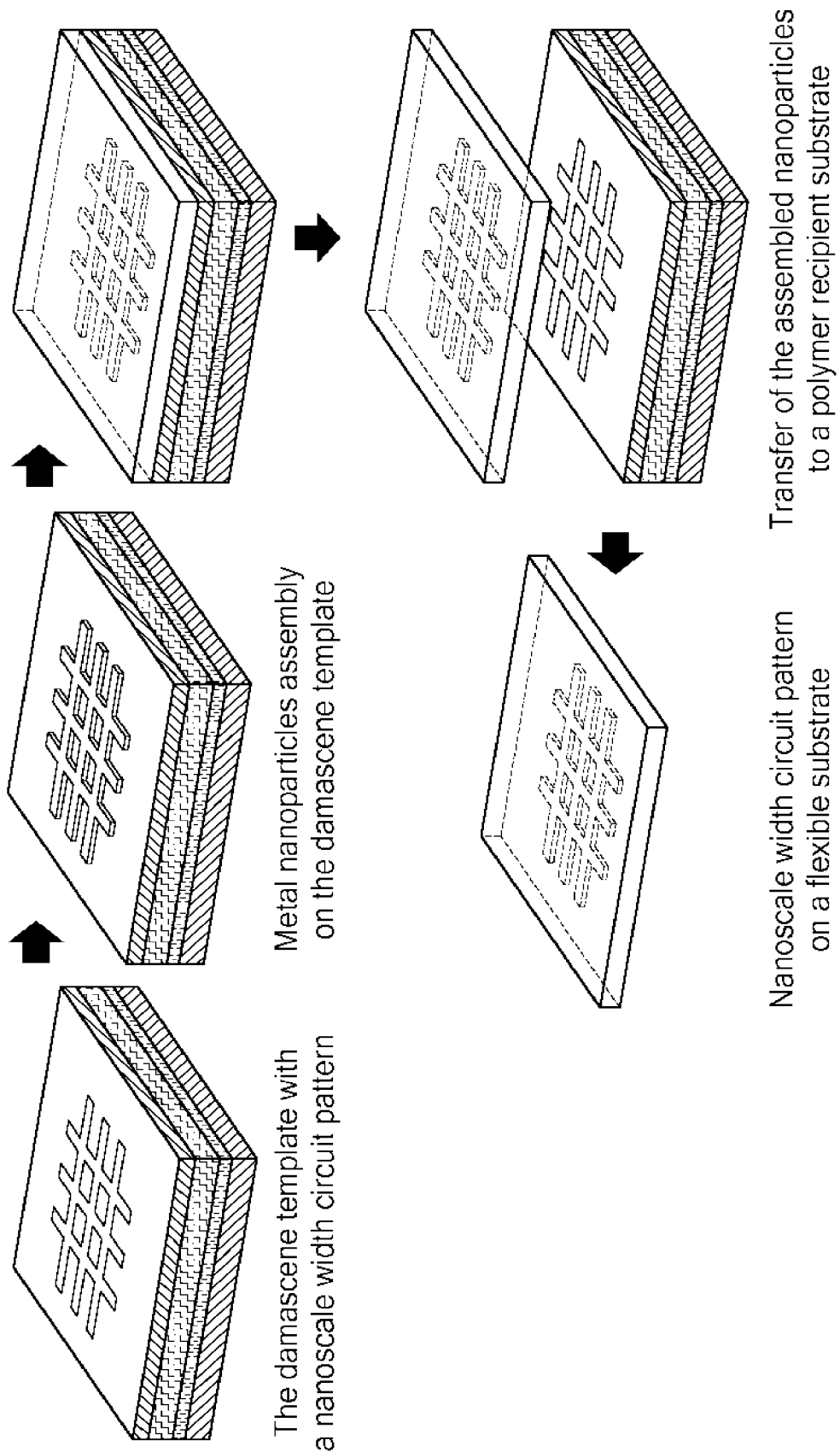
FIG. 9 is a schematic diagram of an embodiment of a fabrication process for a nanocircuit containing a patterned arrangement of nanowires assembled from metal nanoparticles on a flexible polymer substrate according to the present technology.

The damascene template described herein provides an efficient way of fabricating nanoscale metal circuits on a flexible substrate using the assembly and transfer process of metal nanoparticles. This process is schematically shown in FIG. 9.

REFERENCES

1. M. Abulikemu.; E. H. Da'as.; H. Haverinen.; D. Cha.; M. A.; Malik.; G. E. Jabbour.; Angewandte Chemie International Edition 2014, 53, 599.
2. C. J. Hansen.; R. Saksena.; D. B. Kolesky.; J. J. Vericella.; S. J. Kranz.; G. P. Muldowney.; K. T. Christensen.; J. A. Lewis.; Advanced Materials 2013, 25, 2.
3. F. C. Krebs.; N. Espinosa.; M. Hösel.; R. R. Søndergaard.; M. Jørgensen.; Advanced Materials 2014, 26, 29.
4. W. Honda, S. Harada, T. Arie, S. Akita, K. Takei, Advanced Functional Materials 2014.
5. R. Guo.; Y. Yu.; Z. Xie.; X. Liu.; X. Zhou.; Y. Gao.; Z. Liu.; F. Zhou.; Y. Yang.; Z. Zheng.; Advanced Materials 2013, 25, 3343.
6. A. Dzwilewski.; T. Wågberg.; L. Edman.; Journal of the American Chemical Society 2009, 131, 4006.
7. Y. L. Kim.; H. Y. Jung.; S. Park.; B. Li.; F. Liu.; J. Hao.; Y.-K. Kwon.; Y. J. Jung.; S. Kar.; Nature Photonics 2014, 8, 239.
8. X. Xiong.; L. Jaberansari.; M. G. Hahm.; A. Busnaina.; Y. J. Jung.; Small 2007, 3, 2006.
9. A. B. Marciel.; M. Tanyeri.; B. D. Wall.; J. D. Tovar.; C. M. Schroeder.; W. L. Wilson.; Advanced Materials 2013, 25, 6398.
10. J. T. Wang.; J. Wang.; J. J. Han.; Small 2011, 7, 1728.
11. S. Y. Lee.; S. H. Kim.; H. Hwang.; J. Y. Sim.; S. M. Yang.; Advanced Materials, 2014.
12. J. Y. Oh.; J. T. Park.; H. J. Jang.; W. J. Cho.; M. S. Islam.; Advanced Materials; 2014.
13. K. W. Song.; R. Costi.; V. Bulović.; Advanced Materials 2013, 25, 1420.
14. B. Li.; M. G. Hahm.; Y. L. Kim.; H. Y. Jung.; S. Kar.; Y. J. Jung.; ACS Nano 2011, 5, 4826.
15. M. A. Meitl.; Z. T. Zhu.; V. Kumar.; K. J. Lee.; X. Feng.; Y. Y. Huang.; I. Adesida.; R. G. Nuzzo.; J. A. Rogers.; Nature Materials 2005, 5, 33.
16. F. N. Ishikawa.; H. Chang.; K. Ryu.; P. Chen.; A. Badmaev.; L. Gomez De Arco.; G. Shen.; C. Zhou.; ACS Nano 2008, 3, 73.
17. D. Hines.; V. Ballarotto.; E. Williams.; Y. Shao.; S. Solin.; Journal of Applied Physics 2007, 101, 024503.
18. T. Tsai.; C. Lee.; N. Tai.; W. Tuan.; Applied Physics Letters 2009, 95, 013107.
19. J. H. Ahn.; H. S. Kim.; K. J. Lee.; S. Jeon.; S. J. Kang.; Y. Sun.; R. G. Nuzzo.; J. A. Rogers.; Science 2006, 314, 1754.
20. Y. Sun.; H. H. Wang.; Advanced Materials 2007, 19, 2818.
21. D. Lee.; T. Cui.; Biosensors and Bioelectronics 2010, 25, 2259.

22. Y. Park.; H. Jeong.; S. Choi.; H. Jeong.; Planarization of wafer edge profile in chemical mechanical polishing, International Journal of Precision Engineering and Manufacturing 2013, 14(1), pp 11-15.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with "consisting essentially of" or "consisting of".

While the present technology has been described in conjunction with certain preferred embodiments, one of ordinary skill, after reading the foregoing specification, will be able to effect various changes, substitutions of equivalents, and other alterations to the compositions and methods set forth herein.

What is claimed is:

1. A method of fabricating a damascene template for the electrophoretic assembly and transfer of patterned nanoelements, the method comprising the steps of:
    (a) providing a substantially planar substrate;
    (b) depositing an adhesion layer onto the substrate;
    (c) depositing a conductive metal layer onto the adhesion layer;
    (d) depositing a layer of lithography resist onto the conductive metal layer;
    (e) performing lithography to create a two-dimensional pattern of voids in the resist layer, whereby a plurality of surfaces of the conductive metal layer are exposed in the voids;
    (f) depositing a chromium mask layer onto the resist layer, whereby the voids are filled with said chromium to form chromium nanostructures covering the conductive metal layer according to said two-dimensional pattern;
    (g) removing the resist layer and the chromium mask layer thereupon, leaving the chromium nanostructures on the conductive metal layer;
    (h) etching the conductive metal layer which is not covered by the chromium nanostructures, leaving raised conductive metal features in the conductive metal layer corresponding to said two-dimensional pattern;
    (i) depositing an insulating layer onto the chromium nanostructures and exposed conductive metal surfaces in regions between the raised conductive metal features resulting from step (h), wherein the thickness of the insulating layer in the regions between the raised conductive metal features is essentially the same as the height of the raised conductive metal features; and
    (j) etching to remove the chromium nanostructures and portions of the insulating layer covering the chromium nanostructures, forming said damascene template, wherein the damascene template has an essentially planar surface comprising said raised conductive metal features separated by said insulating layer, and wherein surfaces of the raised conductive metal features and the insulating layer are essentially coplanar.

2. The method of claim 1, wherein the etching in step (h) is performed by ion milling.

3. The method of claim 1, wherein the thickness of the insulating layer in the regions between the raised conductive metal features is within about 5%, preferably within about 2%, of the height of the raised conductive metal features.

4. The method of claim 1, wherein the resulting damascene template is essentially free of dishing and erosion defects.

5. The method of claim 1, wherein the method does not comprise the use of chemomechanical polishing.

6. The method of claim 1, wherein the insulating layer comprises silicon dioxide, and further comprising, after step (j):
    (k) silanizing exposed surfaces of the insulating layer with a hydrophobic silane compound.

7. The method of claim 1, wherein the etching of step (j) comprises the use of sonication.

* * * * *